United States Patent
Jin et al.

(10) Patent No.: US 9,312,420 B2
(45) Date of Patent: Apr. 12, 2016

(54) SOLAR CELL AND METHOD FOR MANUFACTURING THE SAME

(71) Applicant: LG ELECTRONICS INC., Seoul (KR)

(72) Inventors: Yoonsil Jin, Seoul (KR); Heejin Nam, Seoul (KR); Sangwook Park, Seoul (KR)

(73) Assignee: LG Electronics Inc., Seoul (KR)

( * ) Notice: Subject to any disclaimer, the term of this patent is extended or adjusted under 35 U.S.C. 154(b) by 12 days.

(21) Appl. No.: 13/767,748

(22) Filed: Feb. 14, 2013

(65) Prior Publication Data

US 2013/0269777 A1    Oct. 17, 2013

(30) Foreign Application Priority Data

Apr. 17, 2012  (KR) .......... 10-2012-0039830
Apr. 17, 2012  (KR) .......... 10-2012-0039832

(51) Int. Cl.
   *H01L 31/0216*   (2014.01)
   *H01L 31/0224*   (2006.01)
   *H01L 31/068*    (2012.01)
   *H01L 31/18*     (2006.01)

(52) U.S. Cl.
   CPC ............. *H01L 31/068* (2013.01); *H01L 31/18* (2013.01); *H01L 31/1804* (2013.01); *Y02E 10/547* (2013.01); *Y02P 70/521* (2015.11)

(58) Field of Classification Search
   CPC ............ H01L 21/2225; H01L 31/1804; H01L 31/022425; H01L 31/18; H01L 31/1864; H01L 31/1868; H01L 31/02168; H01L 31/068; H01L 31/02167; Y02E 10/547; Y02E 10/50; Y02E 10/52; Y02P 70/521
   USPC .................................. 136/243–265
   See application file for complete search history.

(56) References Cited

U.S. PATENT DOCUMENTS

| 2005/0022863 | A1* | 2/2005  | Agostinelli et al. | 136/256 |
| 2009/0068783 | A1* | 3/2009  | Borden             | 438/57  |
| 2009/0260684 | A1  | 10/2009 | You                |         |
| 2009/0301557 | A1* | 12/2009 | Agostinelli et al. | 136/256 |
| 2010/0317192 | A1* | 12/2010 | Neuhaus et al.     | 438/674 |
| 2012/0279563 | A1* | 11/2012 | Meier et al.       | 136/256 |
| 2013/0104975 | A1* | 5/2013  | Krokoszinski       | 136/256 |

FOREIGN PATENT DOCUMENTS

| CN | 101884115 A | 11/2010 |
| CN | 102110743 A | 6/2011  |

OTHER PUBLICATIONS

P. Saint-Cast, E. Billot, P. Olwal, S. Kühnhold, A. Richter, M. Hofmann, J. Rentsch, R. Preu, "Surface Passivation of Highly and Lowly Doped P-type silicon surfaces with PECVD Al2O3 for industrially applicable solar cell concepts", published 2011.*

* cited by examiner

*Primary Examiner* — Jayne Mershon
*Assistant Examiner* — Mayla Gonzalez Ramos
(74) *Attorney, Agent, or Firm* — Birch, Stewart, Kolasch & Birch, LLP

(57) ABSTRACT

A solar cell according to an embodiment of the invention includes a semiconductor substrate; an emitter layer formed at the semiconductor substrate, wherein the emitter layer includes a first portion of a first resistance and a second portion of a second resistance higher than the first resistance, wherein the first portion includes a first dopant and a second dopant having the same conductive type and the second portion including the second dopant; a passivation layer formed on the emitter layer, wherein the passivation layer includes the first dopant; and an electrode electrically connected to the first portion through the passivation layer.

13 Claims, 18 Drawing Sheets

SOLAR CELL AND METHOD FOR MANUFACTURING THE SAME

CROSS-REFERENCE TO RELATED APPLICATIONS

This application claims priority to and the benefit of Korean Patent Application No. 10-2012-0039832, filed on Apr. 17, 2012 and Korean Patent Application No. 10-2012-0039830, filed on Apr. 17, 2012, in the Korean Intellectual Property Office, the disclosures of which are incorporated herein by reference.

BACKGROUND OF THE INVENTION

1. Field of the Invention

Embodiments of the invention relate to a solar cell and a method for manufacturing the same, and more particularly, to a solar cell having a dopant layer of a selective structure and a method for manufacturing the same.

2. Description of the Related Art

Recently, as existing energy resources such as oil or coal are expected to be exhausted, an interest in alternative energy resources for replacing the oil or coal is increasing. In particular, a solar cell that directly converts or transforms solar energy into electricity using a semiconductor element is gaining attention.

In a solar cell, a p-n junction is formed by forming at least one dopant layer in order to induce photoelectric conversion, and an electrode electrically connected to an n-type dopant layer and/or a p-type dopant layer is formed. In order to enhance properties of the dopant layer, a selective structure having portions with different doping concentrations is suggested. However, so as to form the dopant layer of the selective structure, a predetermined mask is used or a doping process is performed several times. That is, a process for manufacturing the dopant layer of the selective structure is complicated, and thus, productivity is low.

SUMMARY OF THE INVENTION

Embodiments of the invention are directed to a solar cell having enhanced properties and a method for manufacturing the solar cell by a simple process.

Embodiments of the invention are directed to a solar cell and a method for manufacturing the solar cell to have an enhanced alignment property between a dopant layer and an electrode.

A solar cell according to an embodiment of the invention includes a semiconductor substrate; an emitter layer formed at the semiconductor substrate, wherein the emitter layer includes a first portion of a first resistance and a second portion of a second resistance higher than the first resistance, wherein the first portion includes a first dopant and a second dopant having the same conductive type and the second portion including the second dopant; a passivation layer formed on the emitter layer, wherein the passivation layer includes the first dopant; and an electrode electrically connected to the first portion through the passivation layer.

A method for manufacturing a solar cell according to an embodiment of the invention includes preparing a semiconductor substrate; forming a passivation layer including a first dopant on a surface of the semiconductor substrate; and forming a selective emitter layer by locally heating a portion of the passivation layer. The first dopant of the heated portion of the passivation layer is diffused into an inside of the semiconductor substrate by the locally heating.

DETAILED DESCRIPTIONS OF THE EMBODIMENTS

Figure 1:
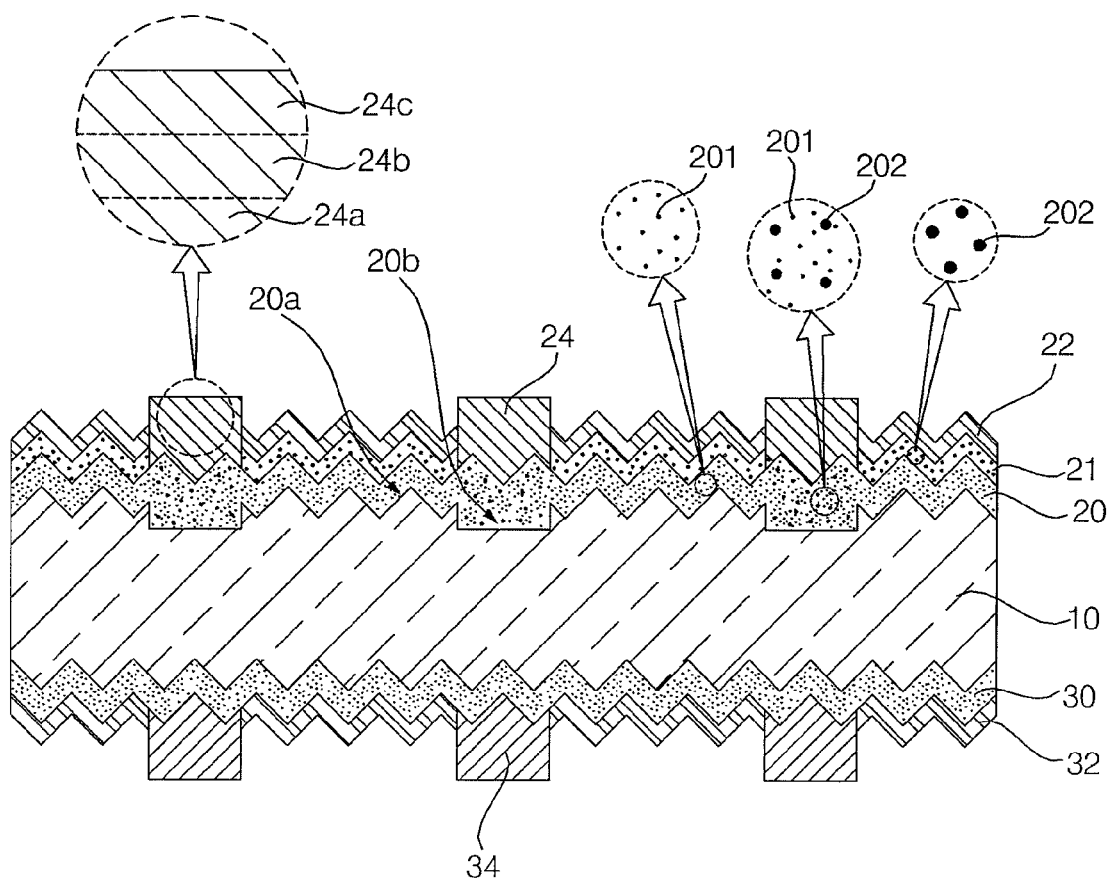
FIG. 1 is a cross-sectional view of a solar cell according to an embodiment of the invention.

Hereinafter, embodiments of the invention will be described with reference to the accompanying drawings. However, the embodiments of the invention are not limited these embodiments of the invention, and the various modifications of the embodiments of the invention are possible.

In order to clearly and concisely illustrate the embodiments of the invention, elements not related to the invention are omitted in the figures. Also, elements similar to or the same as each other have the same reference numerals. In addition, dimensions of layers and regions are exaggerated or schematically illustrated, or some layers are omitted for clarity of illustration. In addition, the dimension of each part as drawn may not reflect an actual size.

In the following description, when a layer or substrate "includes" another layer or portion, it can be understood that the layer or substrate further includes still another layer or portion. Also, when a layer or film is referred to as being "on" another layer or substrate, it can be understood that the layer of film is directly on the other layer or substrate, or intervening layers are also be present. Further, when a layer or film is referred to as being "directly on" another layer or substrate, it can be understood that the layer or film is directly on the another layer or substrate, and thus, there is no intervening layer.

Hereinafter, a solar cell and a method for manufacturing the same according to an embodiment of the invention will be described with reference to the accompanying drawings.

FIG. 1 is a cross-sectional view of a solar cell according to an embodiment of the invention. Referring to FIG. 1, a solar cell 100 according to the embodiment includes a semiconductor substrate 10, an emitter layer 20 formed at or adjacent to a first surface (hereinafter, referred to as "a front surface") of the semiconductor substrate 10, a first passivation layer 21 and an anti-reflection layer 22 formed on the emitter layer 20. Also, the solar cell 100 may include back surface field layer 30 formed at or adjacent to a second surface (hereinafter, referred to as "a back surface") of the semiconductor substrate 10, and a second passivation layer 32 formed on the back surface field layer 30. In addition, the solar cell 100 may include a first electrode (or a plurality of first electrodes) (hereinafter, referred to as "a first electrode") 24 electrically connected to the emitter layer 20, and a second electrode (or a plurality of second electrodes) (hereinafter, referred to as "a second electrode") 34 electrically connected to the semiconductor substrate 10 or the back surface field layer 30. This will be described in more detail.

The semiconductor substrate 10 may include various semiconductor materials. For example, the semiconductor substrate 10 includes silicon having a dopant of a first conductivity type. For the silicon, single crystal silicon or polycrystalline silicon may be used, and the first conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer 20 of a p-type is formed at the front surface of the semiconductor substrate 10, and thereby forming a p-n junction. When light (such as sun light) is incident to the p-n junction, electron-hole pairs are generated, and the electrons generated by the photoelectric effect moves to the back surface of the semiconductor substrate 10 and are collected by the second electrode 34, and the holes generated by the photoelectric effect moves to the front surface of the semiconductor substrate 10 and are collected by the first electrode 24. Then, electric energy is generated.

In this instance, the holes having mobility lower than that of the electrodes move to the front surface of the semiconductor substrate 10, not the back surface of the semiconductor substrate 10. Therefore, the conversion efficiency of the solar cell 100 can be enhanced.

The front and/or back surfaces of the semiconductor substrate 10 may be a textured surface to have protruded and/or depressed portions of various shapes (such as a pyramid shape). When the surface roughness is increased by the protruded and/or depressed portions, reflectance of the incident sun light at the front surface of the semiconductor substrate 10 can be reduced by the texturing. Then, an amount of the light reaching the p-n junction between the semiconductor substrate 10 and the emitter layer 20 can increase, thereby reducing an optical loss of the solar cell 100. However, the embodiments of the invention are not limited thereto, and thus, the protruded and/or depressed portions may be formed only at the front surface, or there may be no protruded and/or depressed portions at the front and back surfaces.

The back surface field layer 30 is formed at the back surface of the semiconductor substrate 10, and has a dopant of the first conductivity type with a doping concentration higher than that of the semiconductor substrate 10. The back surface field layer 30 can reduce or prevent recombination of electrons and holes at the back surface of the semiconductor substrate 10, and can enhance the efficiency of the solar cell 100. The back surface field layer 30 may include an n-type dopant such as phosphorus (P), arsenic (As), bismuth (Bi), antimony (Sb), or the like. In this embodiment of the invention, the back surface field layer 30 has a uniform doping concentration on the whole. However, the embodiments of the invention are not limited thereto. Thus, the back surface field layer 30 may have a selective structure, and such will be described later with reference to FIG. 3.

The second passivation layer 32 and the second electrode 34 may be formed at the back surface of the semiconductor substrate 10. The second passivation layer 32 may be formed substantially at the entire back surface of the semiconductor substrate 10, except for portions where the second electrode 34 is formed. The second passivation layer 32 passivates defects at the back surface of the semiconductor substrate 10. Thus, an open circuit voltage (Voc) of the solar cell 100 can be increased.

The second passivation layer 32 may include a transparent insulating material for passing the light. Thus, the light can be incident to the back surface of the semiconductor substrate 10 through the second passivation layer 32, thereby enhancing the efficiency of the solar cell 100. The second passivation layer 32 may have a single film structure or a multi-layer film structure including, for example, at least one material selected from a group consisting of silicon nitride, silicon nitride including hydrogen, silicon oxide, silicon oxy nitride, $MgF_2$, ZnS, $TiO_2$ and $CeO_2$. However, the embodiments of the invention are not limited thereto, and thus, the second passivation film 32 may include various materials.

The second electrode 34 may be electrically connected to the back surface of the semiconductor substrate 10 (more specifically, to the back surface field layer 30). The second electrode 34 may have a width larger than that of the front electrode 24. Also, the second electrode 34 may have various shapes in a plan view. The second electrode 34 may include various metals, and it will be described later.

The emitter layer 20 of a second conductive type may be formed at the front surface of the semiconductor substrate 10. In this instance, the emitter layer 20 may include a first portion 20b being in contact with the first electrode 24 and a second portion 20a formed adjacent to the anti-reflection film 22 where the first electrode 24 is not formed. The first portion 20b has a doping concentration higher than that of the second portion 20a, and the first portion 20b has a resistance lower than that of the second portion 20a. In this instance, the first portion 20b has a junction depth larger than that of the second portion 20a.

Thus, a shallow emitter can be achieved at the second portion 20a where the sun light is incident, thereby enhancing the efficiency of the solar cell 100. In addition, contact resistance between the first electrode 24 and the first portion 20b can be reduced by the first portion 20b. That is, since the emitter layer 20 has a selective emitter structure, the efficiency of the solar cell 100 can be maximized. Accordingly, the emitter layer 20 may be referred to as a selective emitter layer.

The first portion 20b of the emitter layer 20 has a first dopant 201 and a second dopant 202 of the second conductive types, and the second portion 20a of the emitter layer 20 has a second dopant 202 of the second conductive type. In this instance, the second dopant 202 is doped to the entire front surface of the semiconductor substrate 10 with a uniform concentration. The first dopant 201 is an element that is included in the first passivation layer 21 formed on the emitter layer 20, and is included in the first portion 20b of the emitter layer 20 by diffusion after forming the first passivation layer 21. This will be described in more detail in later descriptions of a method for manufacturing the solar cell 100.

In the embodiment of the invention, the first dopant 201 and the second dopant 202 are different from each other, and thus, the first portion 20b includes the first dopant 201 along with the second dopant 202. However, the embodiments of the invention are not limited thereto, and the first dopant 201 and the second dopant 202 may be the same elements. In this instance, the kinds of the dopant of the first portion 20b and the second portion 20a are the same, and doping concentrations of the first portion 20b and the second portion 20a are different from each other.

A p-type dopant such as a group III element, such as boron (B), aluminum (Al), gallium (Ga), indium (In) or the like may be used for the first and second dopant 201 and 202 of the second conductive type. In this instance, the boron may be used for the second dopant 202 because the boron is suitable to be doped to the semiconductor substrate 10 entirely. The aluminum may be used for the first dopant 201 because the aluminum can be included in the first passivation layer 21 with a shape of an aluminum oxide, and the aluminum oxide can maximize the passivation property. Also, the difference in an atomic radius is small between the aluminum and the silicon that is an element of the semiconductor substrate 10. Thus, the aluminum can be quickly diffused to the emitter layer 20 and can form the first portion 20b by a low-powered laser. Thus, the damage by the laser can decrease. In addition, because the difference in the atomic radius is small, misfit dislocation can be reduced and dislocation density can decrease, thereby enhancing the efficiency of the solar cell 100.

However, the embodiments of the invention are not limited thereto. Thus, the first passivation layer 21 may include a group III element such as boron, gallium, or indium.

The concentration of the first dopant 201 and the concentration of the second dopant 202 may be varied according to desired resistance of the first and second portions 20b and 20a. For example, the concentration of the first dopant 201 may be higher than the concentration of the second dopant 202, and thus, the resistance of the first portion 20b can be largely reduced.

For example, the first portion may have a surface concentration of the first dopant 201 of about $5 \times 10^{20}$ to $5 \times 10^{21}$ atoms/cm$^3$. The surface concentration of the first dopant 201 rarely excesses about $5 \times 10^{21}$ atoms/cm$^3$ due to a limit during the process. When the surface concentration of the first dopant 201 is less than about $5 \times 10^{20}$ atoms/cm$^3$, the resistance of the first portion 20b may not be sufficiently reduced.

In the embodiment of the invention, a junction depth by the emitter layer 20 may be about 0.5 to 2 μm. When the junction depth is larger than about 2 μm, the doping concentration of the emitter layer 20 may increase and it may be difficult to achieved the shallow emitter. When the junction depth is less than about 0.5 μm, the junction depth may be not sufficient.

The first passivation layer 21, the anti-reflection layer 22 and the first electrode 24 may be formed on the emitter 20 at the front surface of the semiconductor substrate 10.

The first passivation layer 21 and the anti-reflection layer 22 may be substantially at the entire front surface of the semiconductor substrate 10, except for the portion where the first electrode 24 is formed. The first passivation layer 21 passivates defects at a surface or a bulk of the emitter layer 20. Thus, the defects at the emitter layer 20 are passivated, recombination sites of minority carrier are reduced or eliminated, thereby increasing an open-circuit voltage (Voc) of the solar cell 100. Accordingly, the open-circuit voltage (Voc) and the short-circuit current (Isc) of the solar cell 100 can be increased by the first passivation layer 21, and thus, the efficiency of the solar cell 100 can be enhanced.

The anti-reflection layer 22 reduces reflectance (or reflectivity) of sun light incident to the front surface of the semiconductor substrate 10. Thus, an amount of the sun light reaching the p-n junction formed between the semiconductor substrate 10 and the emitter layer 20 can be increased, thereby increasing short circuit current (Isc) of the solar cell 100.

In the embodiment of the invention, the first passivation layer 21 includes a material for maximizing the passivation property and having the first dopant 201 of the emitter layer 20. For example, the first passivation layer 21 may include an aluminum oxide. Since the aluminum oxide has a negative charge (or a negative fixed charge), and thus, can effectively induce field effect passivation. By the field effect passivation, the aluminum oxide is most suitable for passivating the emitter layer 20 of the p-type. Also, by diffusing the aluminum included in the aluminum oxide into the semiconductor substrate 10, the first portion 20b having the relatively high concentration and having the relatively low resistance is formed. This will be described in more detail in later descriptions of a method for manufacturing the solar cell 100.

In this instance, the thickness of the first passivation layer 21 may be various for being suitable to the passivation. For example, the first passivation layer 21 may be thicker than the second passivation layer 32 because the first passivation layer 21 is used for the doping of the first dopant 201. In this instance, increased amounts of the first dopant 201 can be doped to the first portion 20b. Accordingly, the resistance of the first portion 20b can be effectively reduced.

The anti-reflection layer 22 may include various materials. For example, the anti-reflection layer 22 may include a silicon nitride layer. However, the embodiments of the invention are not limited thereto. Thus, the anti-reflection layer 22 may have a single film structure or a multi-layer film structure including, for example, at least one material selected from a group consisting of silicon nitride, silicon nitride including hydrogen, silicon oxide, silicon oxy nitride, $MgF_2$, $ZnS$, $TiO_2$ and $CeO_2$.

In this instance, the thickness of the first passivation layer 21 may be different from the thickness of the anti-reflection film 22. In the embodiment of the invention, the anti-reflection layer 22 may be thicker than the first passivation layer 21, considering the function thereof.

For example, the first passivation layer 21 may have a thickness of about 5 to 20 nm, and the anti-reflection layer 22 may have a thickness of about 50 to 120 nm. When the thickness of the first passivation layer 21 is above about 20 nm, the process time for forming the first passivation layer 21 may increase. When the thickness of the first passivation layer 21 is below about 5 nm, the passivation property and the doping of the first dopant 201 are not sufficient. The thickness of the anti-reflection layer 22 is determined by considering the process time and the anti-reflection property. However, the embodiments of the invention are not limited thereto, and the first passivation layer 21 and the anti-reflection layer 22 may have various thicknesses.

The first electrode 24 is electrically connected to the emitter layer 20 (more particularly, to the first portion 20b) by penetrating the first passivation layer 21 and the anti-reflection layer 22. The first electrode 24 may have a structure and a material that can minimize the contact resistance.

The first and second electrodes 24 and 34 may include various materials. For example, the first and second electrodes 24 and 34 may have a plurality of metal layers stacked to each other to enhance various properties. Since the first and second electrodes 24 and 34 may have the same stacking structure, only the structure of the first electrode 24 is shown in FIG. 1. Also, the following description of the stacking structure may be applied to the first and second electrodes 24 and 34.

The first and second electrodes 24 and 34 may include a first metal layer 24a on the semiconductor substrate 10, a second metal layer 24b on the first metal layer 24a, and a third metal layer 24c on the second metal layer 24b. The first to third metal layer 24a, 24b, and 24c may include various materials. For example, the first metal layer 24a may include nickel (Ni), and the second metal layer 24b may include copper (Cu). The third metal layer 24c as a capping layer includes a single layer of tin (Sn), a single layer of silver (Ag), or a stacked-structure of tin and silver.

In this instance, the first metal layer 24a may have a thickness about 300 to 500 nm, and the second metal layer 24b may have a thickness of about 10 to 30 μm. Also, the third metal layer 24c may have a thickness of about 5 to 10 μm. However, the embodiments of the invention are not limited thereto.

The first to third metal layer 24a, 24b, and 24c may be formed by various methods. For example, the first and first to third metal layer 24a, 24b, and 24c may be formed by a plating method. For the plating method, various methods, such as an electro plating method, an electroless plating method, a light induced plating method, may be used.

However, the embodiments of the invention are not limited thereto. The first or second electrode 24 or 34 may be a single layer including various metals (for example, silver) or may include a plurality of layers having various metals.

The solar cell 100 according to the embodiment includes the first passivation layer 21 having the first dopant 201, and thus, the dopant layer (more particularly, the emitter layer 20) having a selective structure can be manufactured by a simple method and a manufacturing cost can be reduced. This will be described in more detail in later descriptions of a method for manufacturing the solar cell 100.

Hereinafter, a method for manufacturing the solar cell 100 according to an embodiment of the invention will be described with reference to FIGS. 2a to 2e. In the following description, the described portions in the above will be omitted, and the not-described portions in the above will be described in more detail.

Figure 2A:
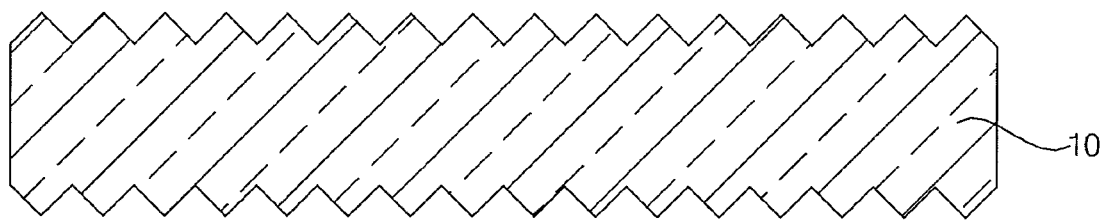
FIGS. 2a to 2e are cross-sectional views for illustrating a method for manufacturing a solar cell according to an embodiment of the invention.

FIGS. 2a to 2e are cross-sectional views for illustrating a method for manufacturing a solar cell according to an embodiment of the invention. First, as shown in FIG. 2a, a semiconductor substrate 10 of a first conductive type is prepared. The front and back surfaces of the semiconductor substrate 10 may be textured to have protruded and/or depressed portions of various shapes (or to have an uneven surface). For the texturing method, a wet etching method or a dry etching method may be used. In the wet etching method, the substrate 10 may be dipped into a texturing solution. According to the wet etching method, the process time can be short. In the dry etching method, the surface of the semiconductor substrate 10 may be etched by a diamond drill or a laser. In the dry etching, the protruded and/or depressed portions can be uniformly formed; however, the semiconductor substrate 10 may be damaged and the process time may be long. Accordingly, the semiconductor substrate 10 may be textured by various methods.

Figure 2B:
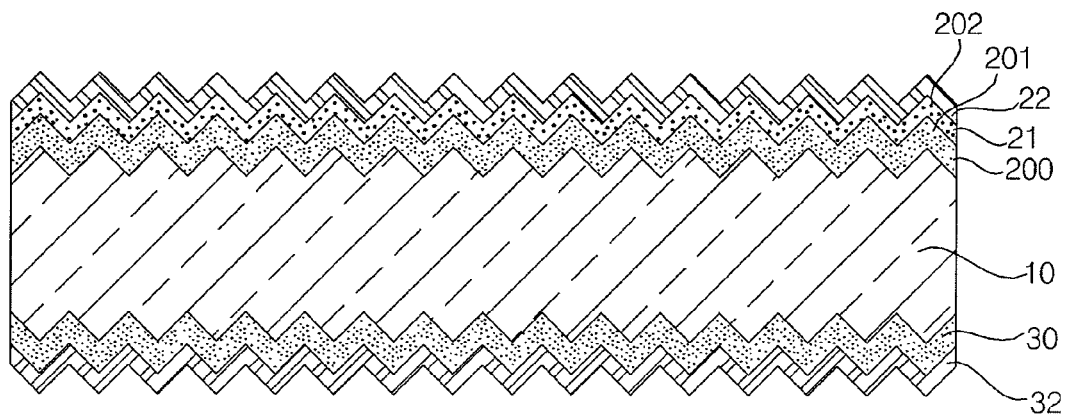

Next, as shown in FIG. 2b, a layer 200 for a dopant layer, a first passivation layer 21, and an anti-reflection layer 22 are formed on a front surface of the semiconductor substrate 10, and a back surface field layer 30 and a second passivation layer 32 are formed on a back surface of the semiconductor substrate 10.

Firstly, the layer 200 for the dopant layer, the first passivation layer 21, and the anti-reflection layer 22 formed at or adjacent to the front surface of the semiconductor substrate 10 may be formed by the following methods.

The layer 200 for the dopant layer may be formed by doping a second dopant 202 of a second conductive type on the front surface of the semiconductor substrate 10. For the doping methods, various methods such as a thermal diffusion method or an ion-implantation method may be used.

In the thermal diffusion method, in the state that the semiconductor substrate 10 is heated, a gaseous compound (for example, $BBr_3$) is diffused. Then, the second dopant 202 is doped to the semiconductor substrate 10. The manufacturing process of the thermal diffusion method is simple, and thus, the manufacturing cost can be reduced.

In the ion-implantation method, the second dopant 202 is ion-implanted and is heat-treated for activation to dope the second dopant 202. More particularly, after the ion-implanting, the semiconductor substrate 10 is damaged or broken and has numerous lattice defects, and the ion-implanted dopant is not activated since the dopant is not positioned at the lattice site. Thus, the mobility of the electrons or the holes is reduced. Accordingly, the ion-implanted dopant is activated by heat-treatment for activation. According to the ion-implantation method, the doping in a lateral direction can be reduced, and thus, the degree of accumulation can be increased and the concentration can be easily controlled. Also, because only one surface of the semiconductor substrate 10 is ion-implanted, the ion-implantation method can be easily used when the front surface and the back surface of the semiconductor substrate 10 are doped with different dopants.

The layer 200 for the dopant layer has a uniform doping concentration on the whole, and has a uniform resistance on the whole. After forming the layer 200 for the dopant layer, the first passivation layer 21 including a first dopant 201 is formed on the layer 200 for the dopant layer. As in the above, the first passivation layer 21 may include an aluminum oxide, and may be easily formed by various methods. For example, the first passivation layer 21 may be formed by an atomic layer deposition (ALD) method. The ALD method is a low-temperature deposition process, and thus, it has advantages in a manufacture process. However, the embodiments of the invention are not limited thereto. Thus, various methods (such as a vacuum evaporation, a chemical vapor deposition, a spin coating, a screen printing, or a spray coating) may be applied.

After forming the first passivation layer 21, the anti-reflection layer 22 is formed on the first passivation layer 21. The anti-reflection layer 22 may be formed by various methods (such as a vacuum evaporation, a chemical vapor deposition, a spin coating, a screen printing, or a spray coating).

Next, the back surface field layer 30 and the second passivation layer 32 formed at or adjacent to the back surface of the semiconductor substrate 10 may be formed by the following methods. The back surface field layer 30 may be formed by doping a third dopant of the first conductive type on the back surface of the semiconductor substrate 10. For the doping methods, various methods such as a thermal diffusion method and an ion-implantation method may be used. The thermal method and the ion-implantation method were described in the above, and detailed descriptions thereof will be omitted.

The back surface field layer 30 has a uniform doping concentration on the whole, and has a uniform resistance on the whole. However, the embodiments of the invention are not limited thereto. Thus, the back surface field layer 30 may have a selective structure in another embodiment that will be described later with reference to FIG. 3.

After forming the back surface field layer 30, the second passivation layer 32 is formed on the back surface field layer

30. The second passivation layer 32 may be formed by various methods (such as a vacuum evaporation, a chemical vapor deposition, a spin coating, a screen printing, or a spray coating).

In the embodiment of the invention, the procedure can be changed in instances where the layer 200 for the doping layer, the first passivation layer 21, and the anti-reflection layer 22 are sequentially formed at the front surface of the semiconductor substrate 10 and the back surface field layer 30, and the second passivation layer 32 are sequentially formed at the back surface of the semiconductor substrate 10.

That is, after the layer 200 for the doping layer, the first passivation layer 21, and the anti-reflection layer 22 are sequentially formed at the front surface of the semiconductor substrate 10, the back surface field layer 30 and the second passivation layer 32 may be sequentially formed at the back surface of the semiconductor substrate 10.

Selectively, after the layer 200 for the dopant layer and the back surface field layer 30 are formed sequentially or simultaneously at the front and back surfaces of the semiconductor substrate 10, the first and second passivation layers 21 and 32 are fouled. Then, the anti-reflection layer 22 is formed. Or, after the layer 200 for the dopant layer and the back surface field layer 30 are formed sequentially or simultaneously at the front and back surfaces of the semiconductor substrate 10, the first passivation layer 21 is formed. Then, the second passivation layer 32 and the anti-reflection layer 22 are formed.

In addition, the layer 200 for the doping layer, the first passivation layer 21, the anti-reflection layer 22, the back surface field layer 30, and the second passivation layer 32 may be formed according to other procedures.

Figure 2C:
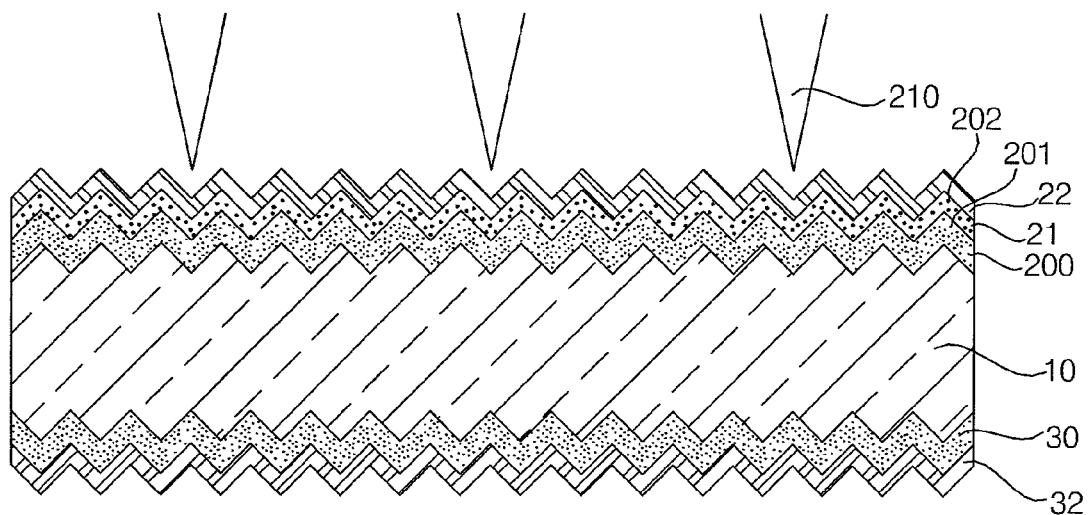
Figure 2D:
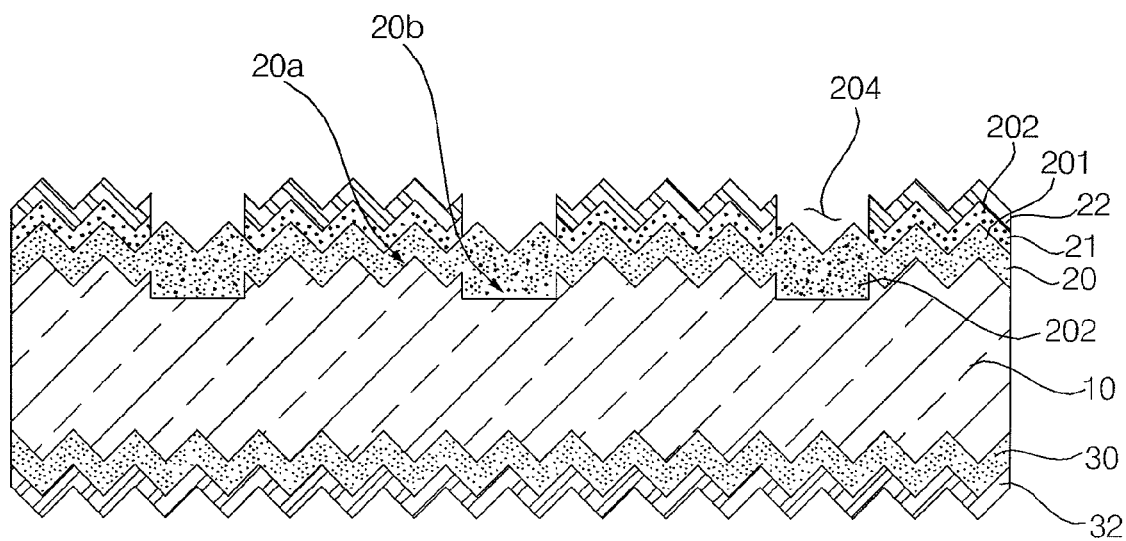

Next, the first passivation layer 21 is selectively heated as shown in FIG. 2c, and thus, an emitter layer 20 having a first portion 20b and a second portion 20a is formed as shown in FIG. 2d. In more detail, a portion of the first passivation layer 21 corresponding to the first portion 20b is selectively heated, and the first dopant 201 of the second conductive type in the first passivation layer 21 is diffused into an inside of the semiconductor substrate 10. Then, the first dopant 201 is diffused only to the first portion 20b. Thus, the first portion 20b includes the first dopant 201, along with the second dopant 202, which is doped when the layer 200 (in FIG. 2b) for the dopant layer is formed. On the other hand, at the second portion 20a, the second dopant 202, which is doped when the layer 200 (in FIG. 2b) for the dopant layer is formed, exists without the first dopant 201. That is, the first portion 20b having the first and second dopants 201 and 202 is formed at the portion which is selectively heated, and the rest portion of the layer 200 for the dopant layer becomes the second portion 20a. In this instance, the first portion 20b has a junction depth larger than that of the second portion 20a.

Various methods for selectively heating the first passivation layer 21 may be used. For example, a laser 210 may be used. Since the second portion 20b is formed by diffusing the first dopant 201 in the first passivation layer 21 by the laser 210, the manufacturing process of the dopant layer having the selective structure can be simplified and the property of the dopant layer can be enhanced.

On the other hand, in a conventional method, the dopant layer having the selective structure is formed by differentiating the dopant dose of the first and second portions through using a mask. In this instance, it is difficult to align the mask accurately, and there is a limit to reducing the widths of the second portion due to a limit of the mask. For example, in the conventional method, the second portions has a minimum width of about 500 μm. Also, the semiconductor substrate is largely damaged at a portion having higher dopant dose, and thus, the semiconductor substrate is heat-treated at a high temperature in order to recover the damage.

In a conventional laser doping selective emitter (LDSE) method, an additional layer for doping is formed on the anti-reflection layer after forming the anti-reflection layer, and then, the laser is irradiated in order to diffuse the dopant into the inside of the semiconductor substrate. According to the method, when the solubility of the dopant to the semiconductor substrate is low (for example, when the dopant is boron), the laser should have a high energy density. Thus, during the laser doping, the semiconductor substrate may be melted. Also, because the dopant should penetrate the anti-reflection layer, the doping to the semiconductor substrate is not easily controlled. In addition, operations for forming the additional layer for the doping and removing the same should be additionally performed.

On the other hand, according to the embodiment of the invention, by using the laser 210, the selective heating can be possible according to a pattern data of a laser apparatus, and the width of the second portion 20b can be minimized. For example, the first portion 20b can have the width of about 150 to 350 μm. Also, the doping can be easily controlled by diffusing the first dopant 201 in a state where the layer 200 for the dopant layer and the first passivation layer 21 are in contact with each other. Thus, the property of the emitter layer 20 can be enhanced.

Also, the first portion 20b is formed by diffusing the first dopant 201 in the first passivation layer 21 for passivation the front surface of the semiconductor substrate 10 through using the selective heating. Thus, operations for forming the additional layer for the doping and removing the same can be omitted. Thus, the process can be simplified and the cost can be reduced.

In the embodiment of the invention, various lasers may be used for the laser 210. For example, the laser 210 may be an Nd—YVO$_4$ laser. The first portion 20b may be heated to a temperature suitable for forming the first portion 20b, for example, about 1200 to 1600° C. The temperature range is decided by considering that a melting temperature of the semiconductor substrate 10 is about 1400° C. Also, in the temperature range, the first dopant 201 of the first passivation layer 21 can be easily diffused.

After irradiating the laser 210, an additional heat-treatment may be performed. Selectively, the emitter layer 20 may be additionally heat-treated by a heat-treatment after forming the first electrode 24 (in FIG. 2e) and the second electrode 34 (in FIG. 2e).

In the embodiment of the invention, when the first passivation layer 21 is selectively heated, an opening 204 can be formed at the anti-reflection layer 22 and the first passivation layer 21. Then, since the opening 204 is accurately positioned on the first portion 20b, the first electrode 24 formed through the opening 204 can be accurately aligned with the second portion 20b.

Figure 2E:
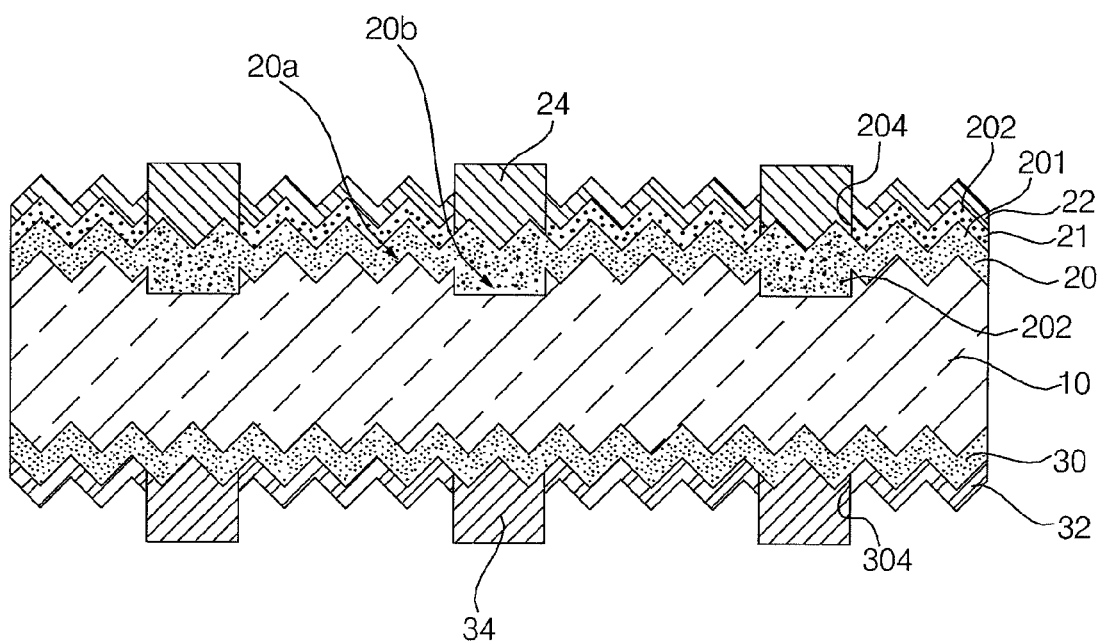

Next, as shown in FIG. 2e, the first electrode 24 electrically connected to the first portion 20b of the emitter layer 20 and the second electrode 34 electrically connected to the back surface field layer 30 (or, the semiconductor substrate 10) are formed. The first electrode 24 may be formed inside the opening 204 formed at the first passivation layer 21 and the anti-reflection layer 22 by various methods, such as a plating method or a deposition method. Also, after forming an opening 304 at the second passivation layer 32, the second electrode 34 may be formed inside the opening 304 by various methods, such as a plating method or a deposition method.

In the embodiment of the invention, an additional heat-treatment may be performed after forming the first electrode 24 and the second electrode 34. In the additional heat-treatment, the emitter layer 20 may be heat-treated also. This additional heat-treatment may be performed at a temperature of about 200 to 4000° C. for one minute to hundred minutes under a nitrogen atmosphere. However, the embodiments of the invention are not limited thereto, and thus, conditions of the additional heat-treatment can be changed.

Selectively, the first and second electrodes 24 and 34 may be formed by fire-through or laser firing contact of printed pastes for the first and second electrodes 24 and 34. For example, the pastes may be printed by various methods such as a screen printing method. In this instance, because the opening 304 at the second passivation layer 32 is naturally formed during the fire-through of the laser firing contact, the operation for forming the opening 304 is not necessary.

As in the above, according to the embodiment of the invention, the emitter layer 20 having the selective emitter structure can be formed by a simple process, and the property of the emitter layer 20 and the align property of the emitter layer 20 and the first electrode 24 can be enhanced.

In the above embodiment of the invention, the semiconductor substrate 10 and the back surface field layer 30 are n-types, the emitter layer 20 is a p-type, and the first passivation layer 21 includes a compound having the group III element (for example, aluminum oxide). Thus, the group III element is diffused to form the first portion 20b of the emitter layer 20. However, the embodiments of the invention are not limited thereto.

Therefore, the semiconductor substrate 10 and the back surface field layer 30 may be p-types, the emitter layer 20 is an n-type, and the first passivation layer 21 includes a compound having the group V element. Thus, the group V element is diffused to form the first portion 20b of the emitter layer 20. For example, the first passivation layer 21 may include bismuth oxide (for example, $Bi_2O_3$), and the first portion 20b of the emitter layer 20 may include bismuth as the first dopant 201. In this instance, phosphorus may be used for the second dopant 202 because the phosphorus is suitable to be doped to the semiconductor substrate 10 entirely. However, the embodiments of the invention are not limited thereto. Thus, one or more of various elements other than the bismuth may be used as the first dopant 201, and one or more of various elements other than the phosphorus may be used as the second dopant 202.

Hereinafter, a solar cell and a method for manufacturing the same according to other embodiments of the invention will be described. In the following description, the portions same as or similar to the portion of the above embodiments of the invention will be omitted, and the different portions will be described in more detail.

Figure 3:
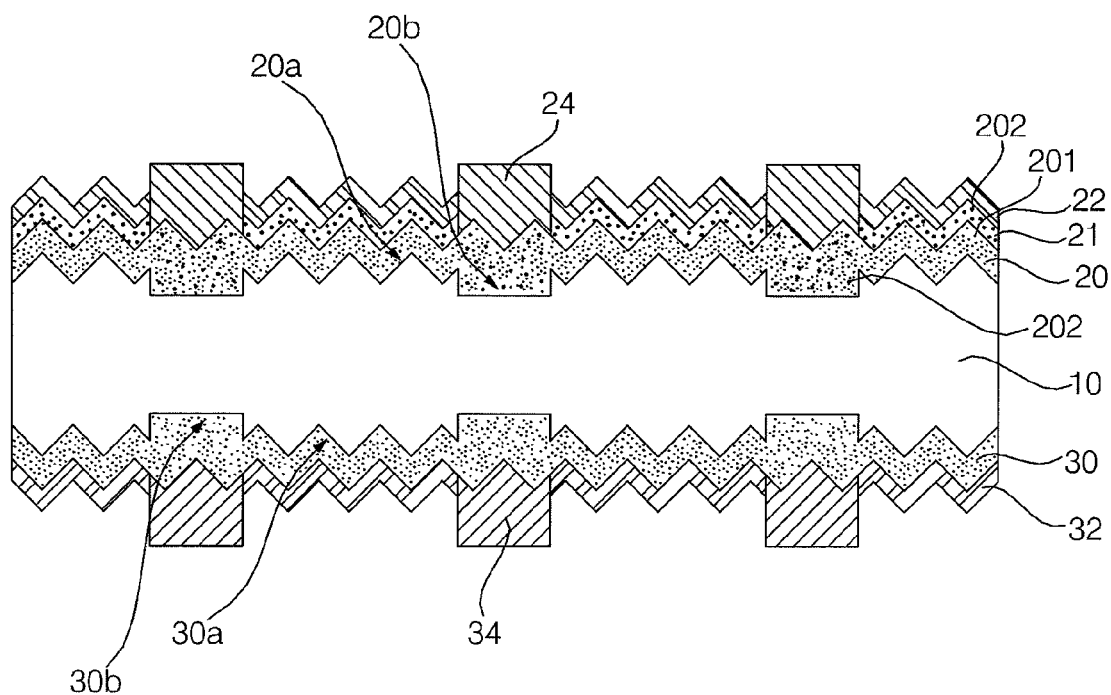
FIG. 3 is a cross-sectional view of a solar cell according to another embodiment of the invention.

FIG. 3 is a cross-sectional view of a solar cell according to another embodiment of the invention. Referring to FIG. 3, in the solar cell 100a according to the embodiment of the invention, a back surface field layer 30 has a selective structure. Thus, the back surface field layer 30 may include a first portion 30b being in contact with the second electrode 34 and a second portion 30b formed at a portion where the second electrode 34 is not formed. The first portion 30b has a doping concentration higher than that of the second portion 30a, and the first portion 30b has a resistance lower than that of the second portion 30a. In this instance, the first portion 30b has a junction depth larger than that of the second portion 30a.

Then, the recombination of the electrons and the holes can be effectively reduced or prevented at the second portion 30a of the back surface field layer 30, and contact resistance between the second electrode 34 and the first portion 30b can be reduced by the first portion 30b. That is, the loss due to the recombination can be reduced, and delivery of the electrons or the holes generated by the photoelectric conversion to the second electrode 34 can be increased. Accordingly, the efficiency of the solar cell 100a can be increased or maximized.

The back surface field layer 30 may be formed by various methods. For example, when the back surface field layer 30 is formed (in FIG. 2b), a dopant of the first conductive type is ion-implanted by using a mask of a comb shape. Then, the first portion 30b is doped with the dopant to have a relatively high doping concentration, and thus, has a relatively low resistance. Selectively, when the back surface field layer 30 is formed by ion-implanting the dopant of the first conductive type, the ion-implanting is carried out several times so that the second portion can have a relatively low resistance.

Figure 4A:
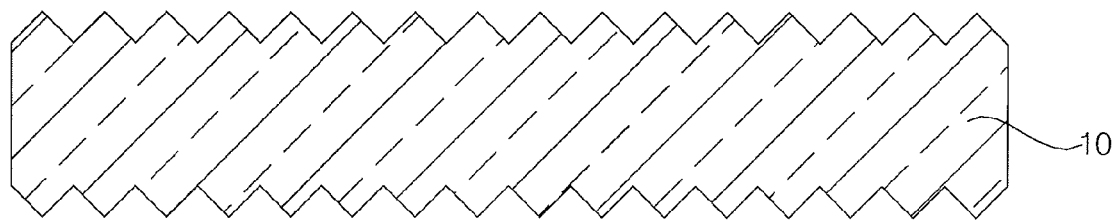
FIGS. 4a to 4f are cross-sectional views for illustrating a method for manufacturing a solar cell of FIG. 3 according to an embodiment of the invention.
Figure 4B:
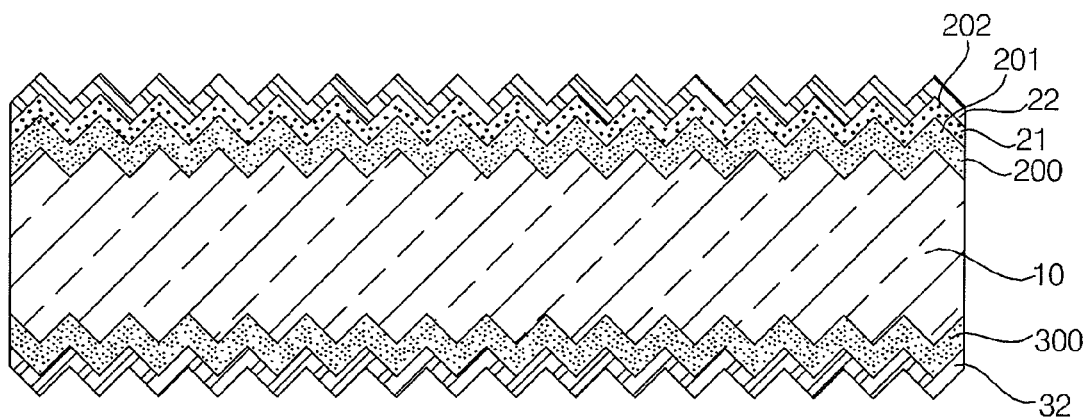

Selectively, as shown in FIGS. 4a to 4f, a laser doping selective emitter (LDSE) method may be used. This will be described in more detail. First, as shown in FIG. 4a, a semiconductor substrate 10 of a first conductive type is prepared. Next, as shown in FIG. 4b, a layer 200 for a dopant layer, a first passivation layer 21, and an anti-reflection layer 22 are formed on a front surface of the semiconductor substrate 10, and a back surface field layer 30 and a second passivation layer 32 are formed on a back surface of the semiconductor substrate 10.

Figure 4C:
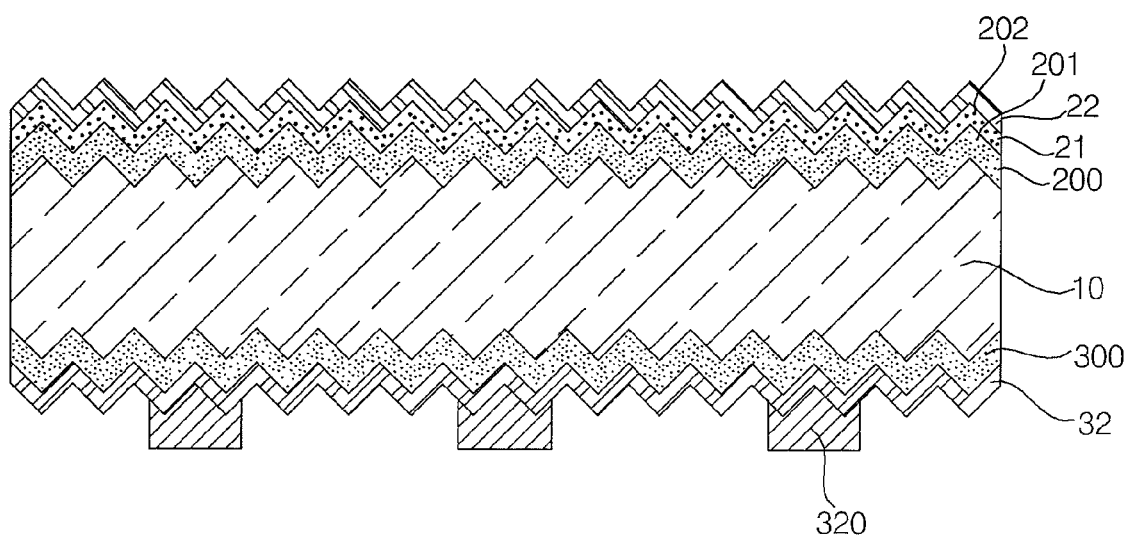

Next, as shown in FIG. 4c, an additional layer 320 for doping that includes a third dopant of the first conductive type is formed on the second passivation layer 32. The additional layer 320 for doping may include a group V element, such as phosphorus (P), arsenic (As), bismuth (Bi), antimony (Sb), or the like. The additional layer 320 may be formed on the second passivation layer 32 by a coating.

Figure 4D:
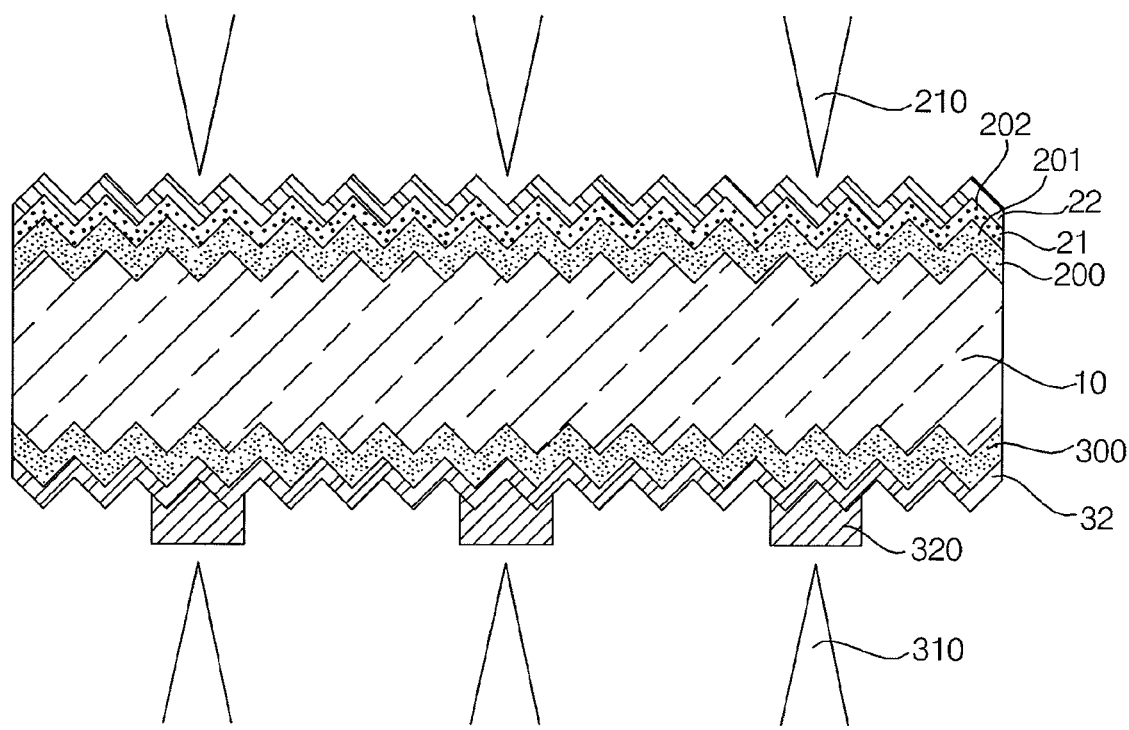

Next, as shown in FIG. 4d, the front surface of the semiconductor substrate 10 is heated by a laser 210 and the back surface of the semiconductor substrate 10 is heated by a laser 310.

Figure 4E:
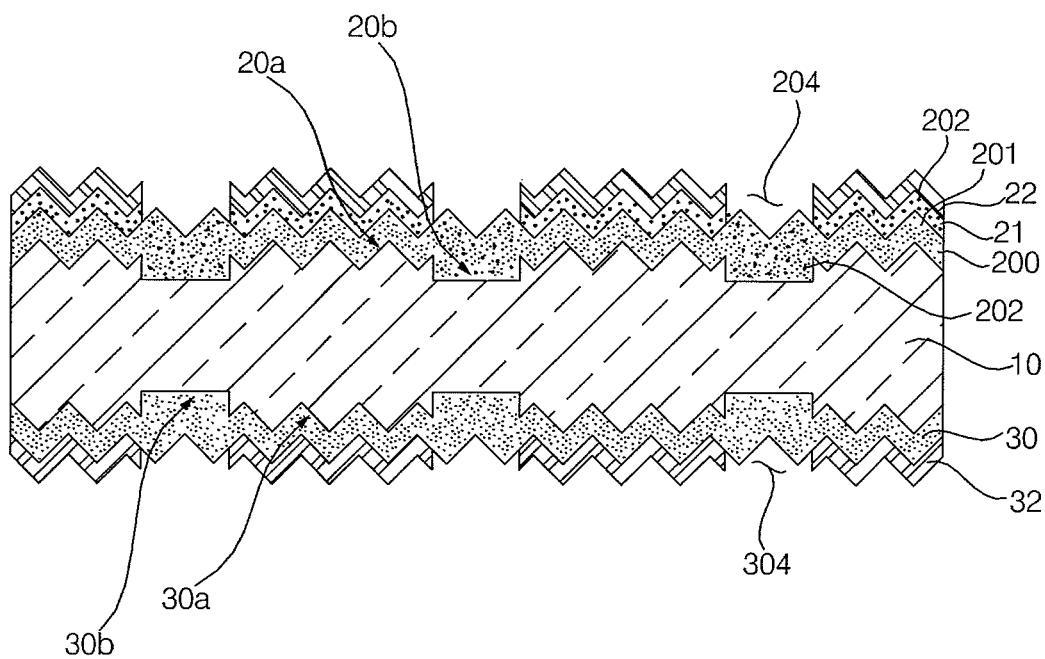

Then, at the front surface of the semiconductor substrate 10, the first portion 20b of the emitter layer 20 is formed by diffusing the first dopant 201 included in the first passivation layer 21. Also, at the back surface of the semiconductor substrate 10, the first portion 30b of the back surface field layer 30 is formed by diffusing the third dopant of the first conductive type included in the additional layer 320 for doping. At the same time, as shown in FIG. 4e, the opening 204 is formed at the first passivation layer 21 and the anti-reflection layer 22 to correspond to the first portion 20b of the emitter layer 20, and the opening 304 is formed at the second passivation layer 32 to correspond to the first portion 30b of the back surface field layer 30.

In this instance, after the laser 210 is irradiated to the front surface of the semiconductor substrate 10 to form the first portion 20b of the emitter layer 20, the laser 310 may be irradiated to the back surface of the semiconductor substrate 10 to form the first portion 30b of the back surface field layer 30. Selectively, after the laser 310 is irradiated to the back surface of the semiconductor substrate 10 to form the first portion 30b of the back surface field layer 30, the laser 210 may be irradiated to the front surface of the semiconductor substrate 10 to form the first portion 20b of the emitter layer 20.

Figure 4F:
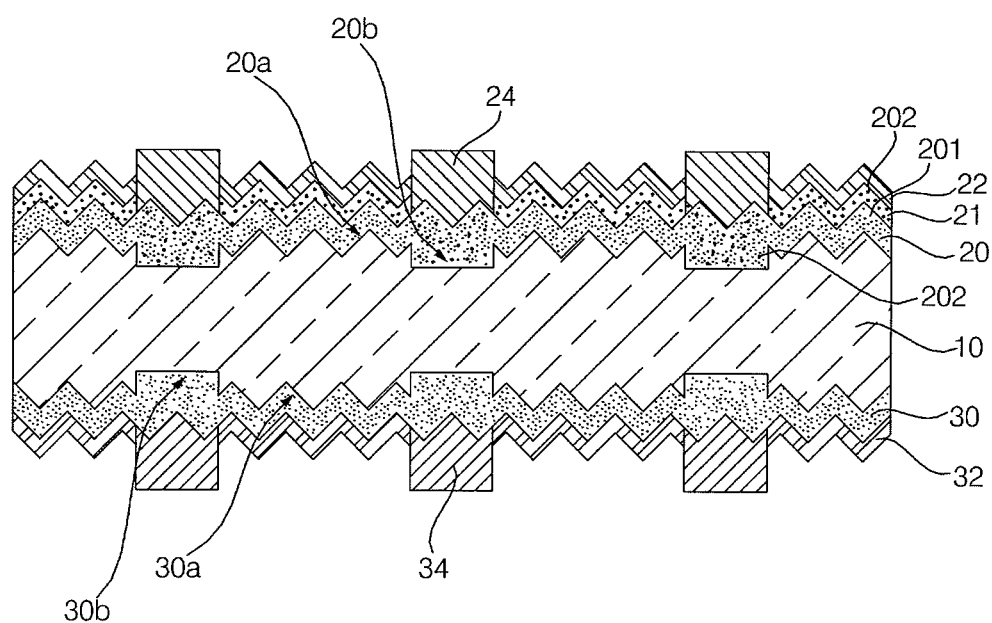

Selectively, as shown in FIG. 4d, the lasers 210 and 310 are irradiated at the same time to the both surfaces of the semiconductor substrate 10, and thus, the first portions 20b and 30b of the emitter layer 20 and the back surface field layer 30 can be formed simultaneously. Then, the process can be simplified even more. Next, after removing the additional layer 320 for doping, the first and second electrodes 24 and 34 are formed in the openings 204 and 304 as shown in FIG. 4f.

Figure 5:
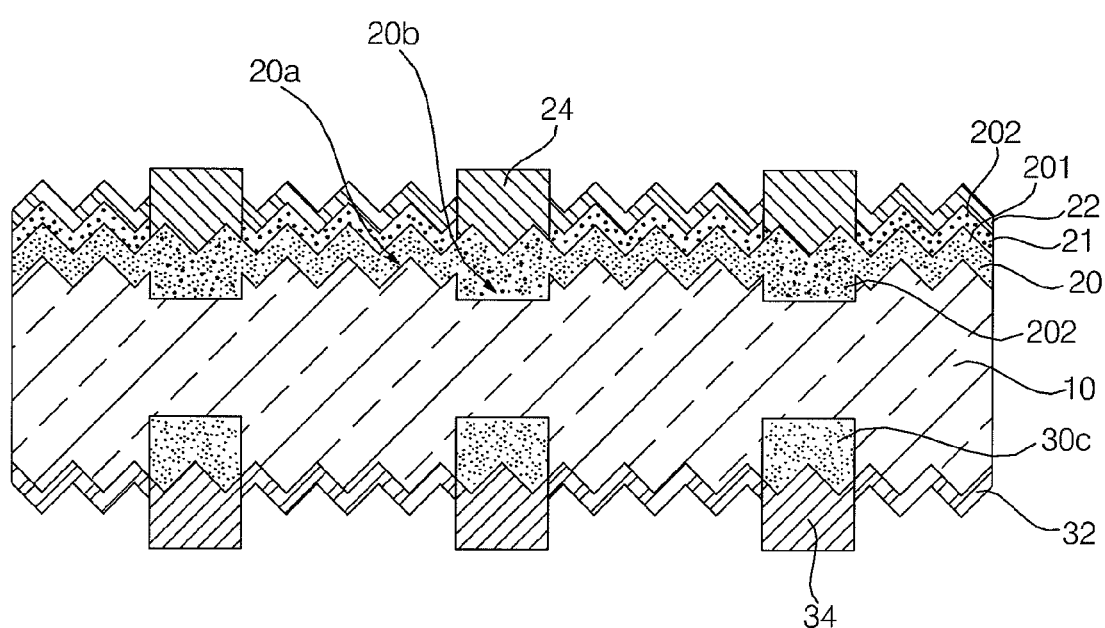
FIG. 5 is a cross-sectional view of a solar cell according to still another embodiment of the invention.

FIG. 5 is a cross-sectional view of a solar cell according to still another embodiment of the invention. In the following description, description of the portions same as or similar to the portion of the above embodiments of the invention will be omitted, and description of the different portions will be described in more detail.

Referring to FIG. 5, in the solar cell 100b according to the embodiment of the invention, a back surface field layer 30c is locally formed to correspond to the second electrode 34. According to the embodiment of the invention, the recombination of the electrons and the holes can be effectively reduced or prevented at the back surface field layer 30, and contact resistance with the second electrode 34 can be reduced. The back surface field layer 30c may be formed by various methods. For example, when the back surface field layer 30c is formed (in FIG. 2b), a dopant of the first conductive type is ion-implanted by using a mask.

Figure 6A:
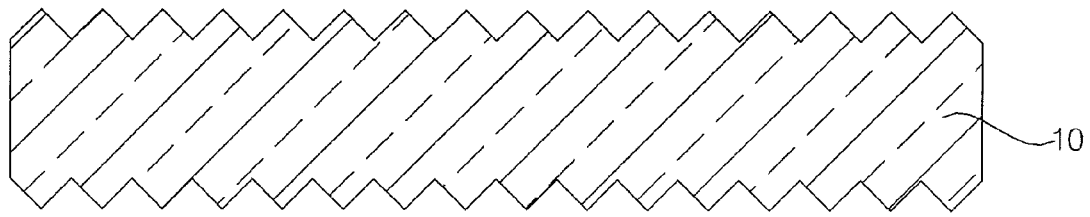
FIGS. 6a to 6e are cross-sectional views for illustrating a method for manufacturing a solar cell of FIG. 5 according to an embodiment of the invention.
Figure 6B:
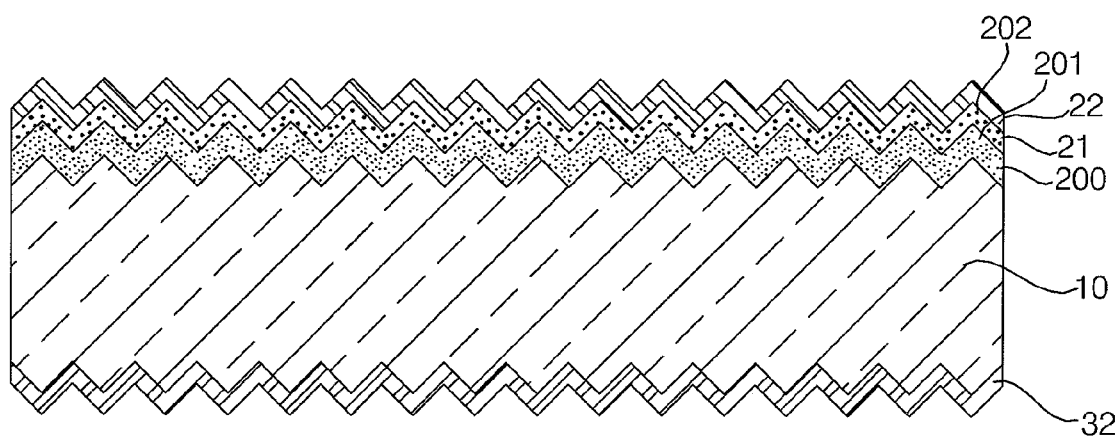

Selectively, as shown in FIGS. 6a to 6f, a laser doping selective emitter (LDSE) method may be used to form the back surface field layer 30c. This will be described in more detail. First, as shown in FIG. 6a, a semiconductor substrate 10 of a first conductive type is prepared. Next, as shown in FIG. 6b, a layer 200 for a dopant layer, a first passivation layer 21, and an anti-reflection layer 22 are formed on a front surface of the semiconductor substrate 10, and a second passivation layer 32 are formed on a back surface of the semiconductor substrate 10. That is, the back surface field layer 30c is not formed before the second passivation layer 32 in the embodiment of the invention, contrary to the above embodiments.

Figure 6C:
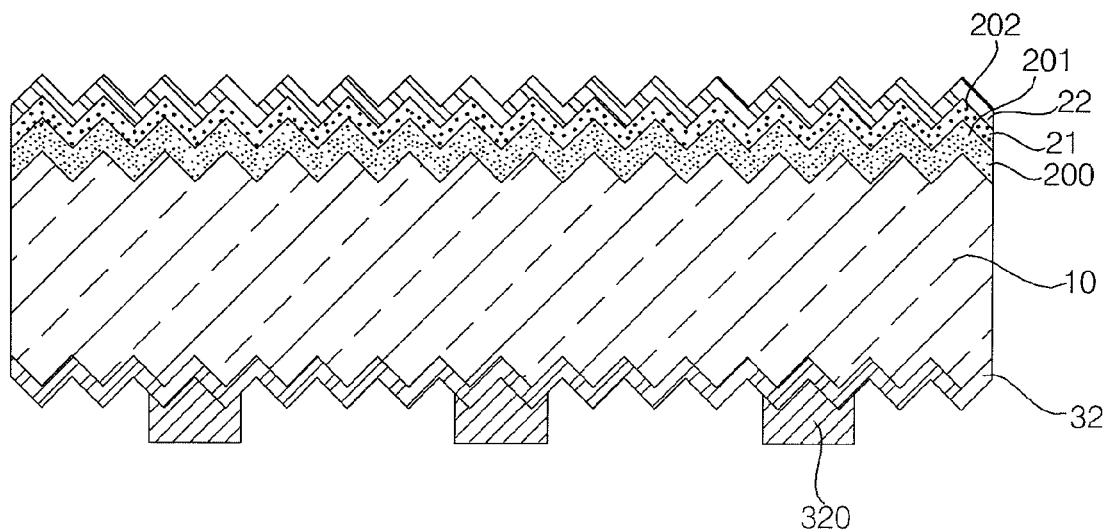
Figure 6D:
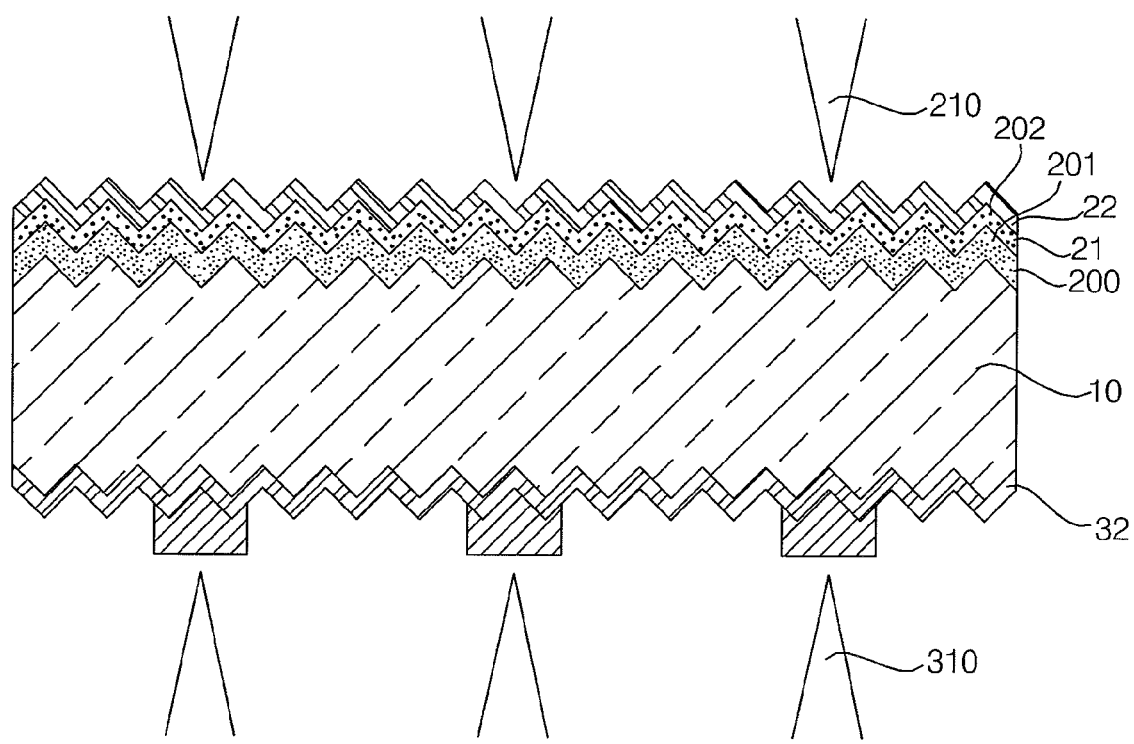

Next, as shown in FIG. 6c, an additional layer 320 for doping that includes a third dopant of the first conductive type is formed on the second passivation layer 32. Next, as shown in FIG. 6d, the front surface of the semiconductor substrate 10 is heated by a laser 210 and the back surface of the semiconductor substrate 10 is heated by a laser 310.

Figure 6E:
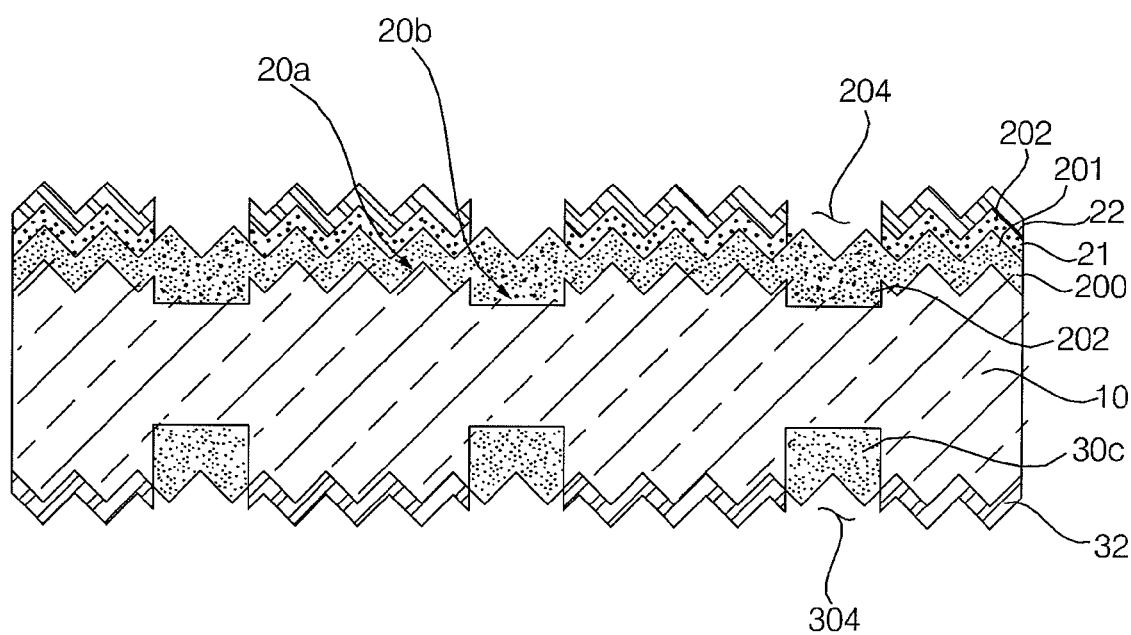

Then, as shown in FIG. 6e, at the front surface of the semiconductor substrate 10, the first portion 20b of the emitter layer 20 is formed by diffusing the first dopant 201 included in the first passivation layer 21. Also, at the back surface of the semiconductor substrate 10, the back surface field layer 30c is locally formed by diffusing the third dopant of the first conductive type included in the additional layer 320 for doping. At the same time, as shown in FIG. 6e, the opening 204 is formed at the first passivation layer 21 and the anti-reflection layer 22 to correspond to the first portion 20b of the emitter layer 20, and the opening 304 is formed at the second passivation layer 32 to correspond to the back surface field layer 30c.

Next, after removing the additional layer 320 for doping, the first and second electrodes 24 and 34 are formed in the openings 204 and 304 as shown in FIG. 6f.

Figure 7:
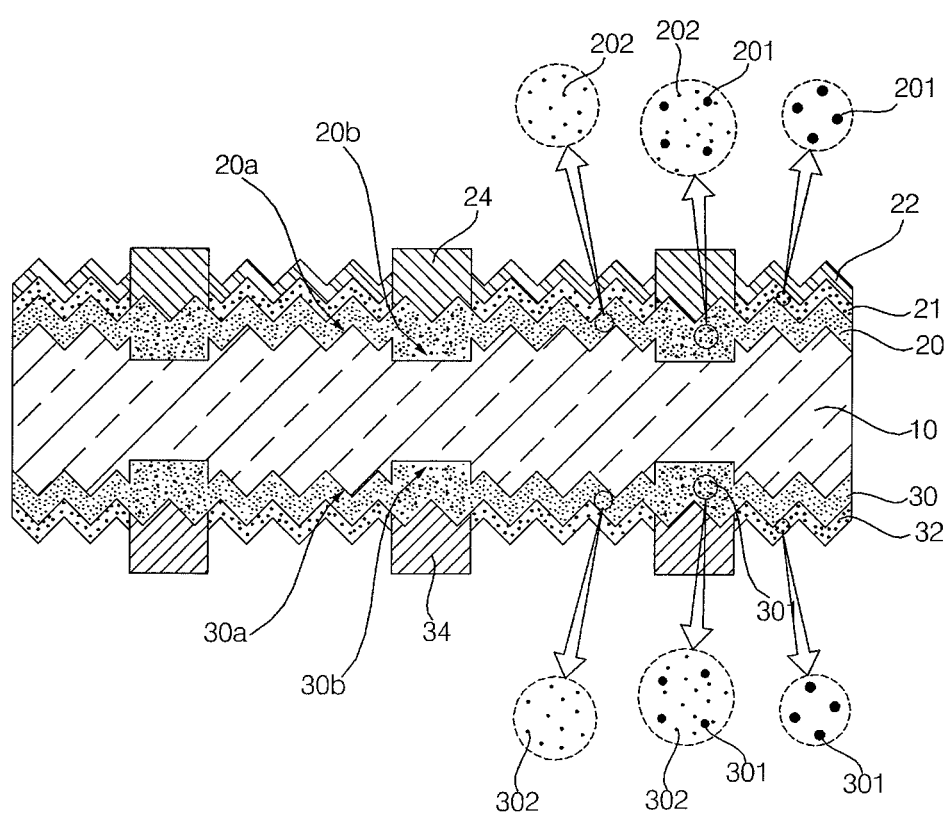
FIG. 7 is a cross-sectional view of a solar cell according to still another embodiment of the invention.

FIG. 7 is a cross-sectional view of a solar cell according to still another embodiment of the invention. Referring to FIG. 7, in a solar cell 100c according to an embodiment of the invention, a first dopant 201 included in a first passivation layer 21 is diffused and is included in a first portion 20b of an emitter layer 20, and a first dopant 301 included in a second passivation layer 32 is diffused and is included in a first portion 30b of a back surface field layer 30. That is, as well as the emitter layer 20, the back surface field layer 30 also has a selective structure by using the third dopant 301 included in the second passivation layer 32. In this instance, after a second dopant 202 and a fourth dopant 204 are entirely doped to a front surface and a back surface of an semiconductor substrate 10 uniformly, respectively, the first dopant 201 and the third dopant 301 are diffused to form the first portions 20b and 30b by irradiating a laser to the first and second passivation layer 21 and 32, respectively. The method for manufacturing the emitter layer 20 and the back surface field layer 30 is the same as or similar to the method for manufacturing the emitter layer 20 described with reference to FIGS. 2a to 2e, and thus, the detailed descriptions thereof are omitted. A thickness of the second passivation layer 32 and concentration of the third dopant 301 are the same as or similar to the thickness of the first passivation layer 21 and the concentration of the first dopant 201, respectively, and thus, the detailed descriptions thereof are omitted.

When the semiconductor substrate 10 and the back surface field layer 30 are n-types and the emitter layer 20 is a p-type, the first passivation layer 21 may include a compound (for example, aluminum oxide) having the group III element (for example, aluminum) and the second passivation layer 32 may include a compound (for example, bismuth oxide) having the group V element (for example, bismuth). In this instance, boron may be used for the second dopant 202 because the boron is suitable to be doped to the semiconductor substrate 10 entirely. Also, phosphorus may be used for the fourth dopant 302 because the phosphorus is suitable to be doped to the semiconductor substrate 10 entirely.

When the semiconductor substrate 10 and the back surface field layer 30 are p-types and the emitter layer 20 is an n-type, the first passivation layer 21 may include a compound (for example, bismuth oxide) having the group V element (for example, bismuth). Also, the second passivation layer 32 may include a compound (for example, aluminum oxide) having the group III element (for example, aluminum). In this instance, phosphorus may be used for the second dopant 202 because the phosphorus is suitable to be doped to the semiconductor substrate 10 entirely. Also, boron may be used for the fourth dopant 302 because the boron is suitable to be doped to the semiconductor substrate 10 entirely.

However, the embodiments of the invention are not limited thereto. Thus, one or more of other various elements may be used the first dopant 201, the second dopant 202, the third dopant 301, and the fourth dopant 302.

As in the above, according to the embodiment of the invention, the emitter layer 20 and the back surface field layer 30 having the selective structures can be formed by a simple process, and the property of the emitter layer 20 and the back surface field layer 30 and the align property between the emitter layer 20 and the first electrode 24, and between the back surface field layer 30 and the second electrode 34 can be enhanced.

Figure 8:
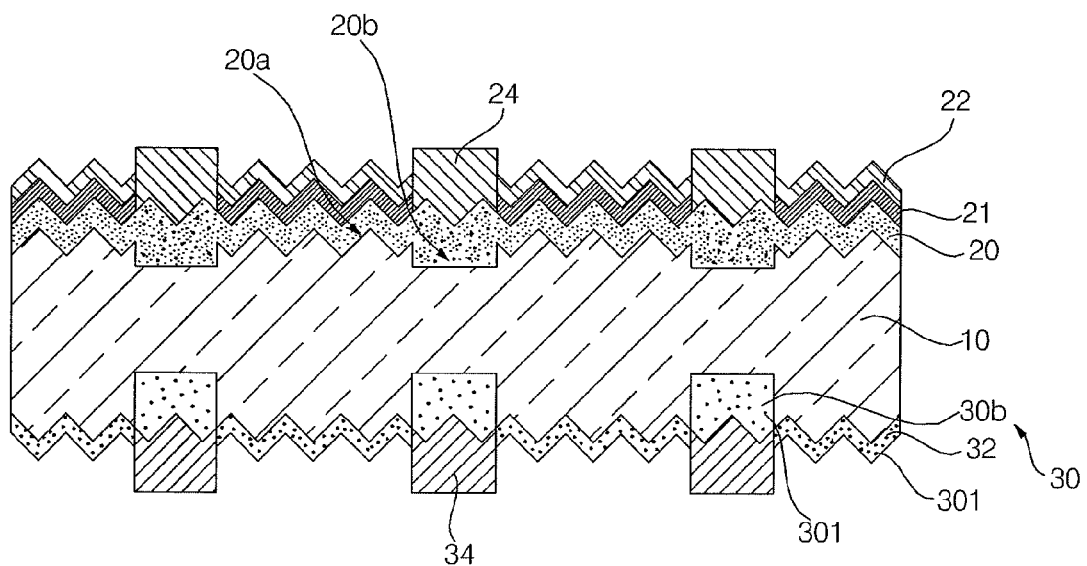
FIG. 8 is a cross-sectional view of a solar cell according to another embodiment of the invention.

FIG. 8 is a cross-sectional view of a solar cell according to still another embodiment of the invention. Referring to FIG. 8, in a solar cell 100d according to an embodiment of the invention, a back surface field layer 30 only include a first portion 30b being in contact with the second electrode 34. The back surface field layer 30 only having the first portion 30b may be formed by omitting the operation for doping the fourth dopant 302 entirely. Accordingly, the first portion 30b includes the third dopant 301 and does not include the fourth dopant 302.

According to the embodiment of the invention, the recombination of the electrons and the holes can be effectively reduced or prevented at the back surface field layer 30, and contact resistance with the back electrode 34 can be reduced. Thus, the efficiency of the solar cell 100d can be enhanced.

In the embodiments of the invention, the second passivation layer 32 is selectively heated by the laser and the back surface field layer 30 has the selective structure or the local structure. However, the embodiments of the invention are not limited thereto.

Figure 9:
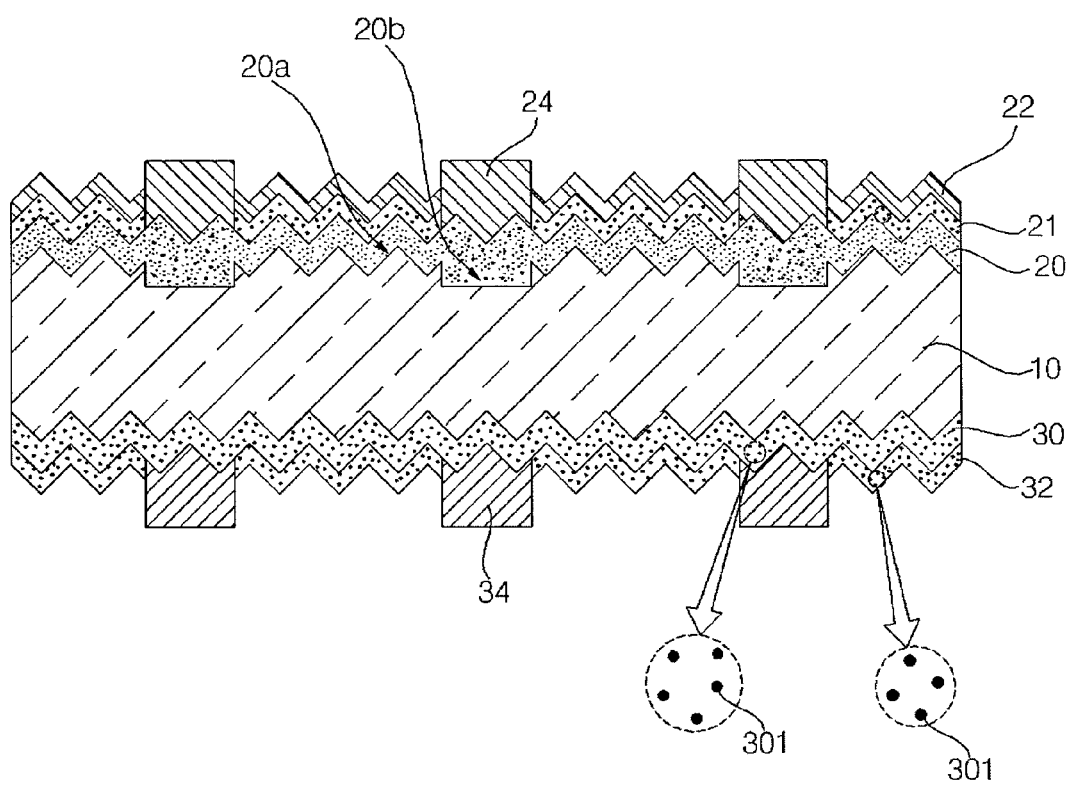
FIG. 9 is a cross-sectional view of a solar cell according to still another embodiment of the invention.

Therefore, as shown in FIG. 9, a back surface field layer 30 of a solar cell 100e has a homogeneous structure having uniform concentration. To form the back surface field layer 30 having this structure, the second passivation layer 32 is formed, and the second passivation layer 32 is entirely heated. Then, a third dopant 301 of the second passivation layer 32 is diffused to the inside of the semiconductor substrate 10, and the back surface field layer 30 of the homogeneous structure is formed. For the method for entirely heating the second passivation layer 32, one or more of various methods, such as, a method for heat-treating at a diffusion furnace or a method for heat-treating through a laser, may be used.

After that, an opening is formed at the second passivation layer 32, and a second electrode 34 is formed. However, the embodiments of the invention are not limited thereto. Thus, the second electrode 34 may be formed by using a paste inducing the fire-through.

Hereinafter, embodiments of the invention will be described in greater detail through an experimental example. The experimental example is provided only for illustrative purpose of the embodiments of the invention and the embodiments of the invention are not limited thereto.

Experimental Embodiment

An n-type semiconductor substrate was prepared. Boron as a p-type dopant was doped to a front surface of the semiconductor substrate, and phosphorus as an n-type dopant was doped to a back surface of the semiconductor substrate to form a back surface field layer. A first passivation layer including an aluminum oxide and an anti-reflection layer including silicon nitride were formed on the front surface of the semiconductor substrate, and a second passivation layer including a silicon nitride layer and a silicon oxide layer was formed on the back surface of the semiconductor substrate. A laser was irradiated to the front surface of the semiconductor substrate to selectively heat the first passivation layer and the aluminum was diffused, and thus, the second portion of the emitter layer was formed. Then, a first paste was screen-printed on the front surface of the semiconductor substrate, a second paste was screen-printed on the back surface of the semiconductor substrate, and they were fired to form a first electrode and a second electrode. Then, an isolation process was performed.

Comparative Embodiment

A solar cell was manufactured by the same method of Experimental Embodiment except for the method for manufacturing the second portion of the emitter layer. That is, in the Comparative Embodiment, the first passivation layer included silicon oxide. Also, after forming the anti-reflection layer, an additional layer for doping that includes aluminum was formed on the anti-reflection layer. Then, the laser was irradiated to the additional layer for doping, and the aluminum was diffused, and thus, the second portion of the emitter layer was formed. After that, the additional layer for doping was removed. The other processes were the same as in the Experimental Embodiment.

The boron concentration and the aluminum concentration with respect to a distance from the front surface of the semiconductor substrate in the solar cells according to the Experimental Embodiment and the Comparative Embodiment were measured. The results are shown in FIG. 10.

Figure 10:
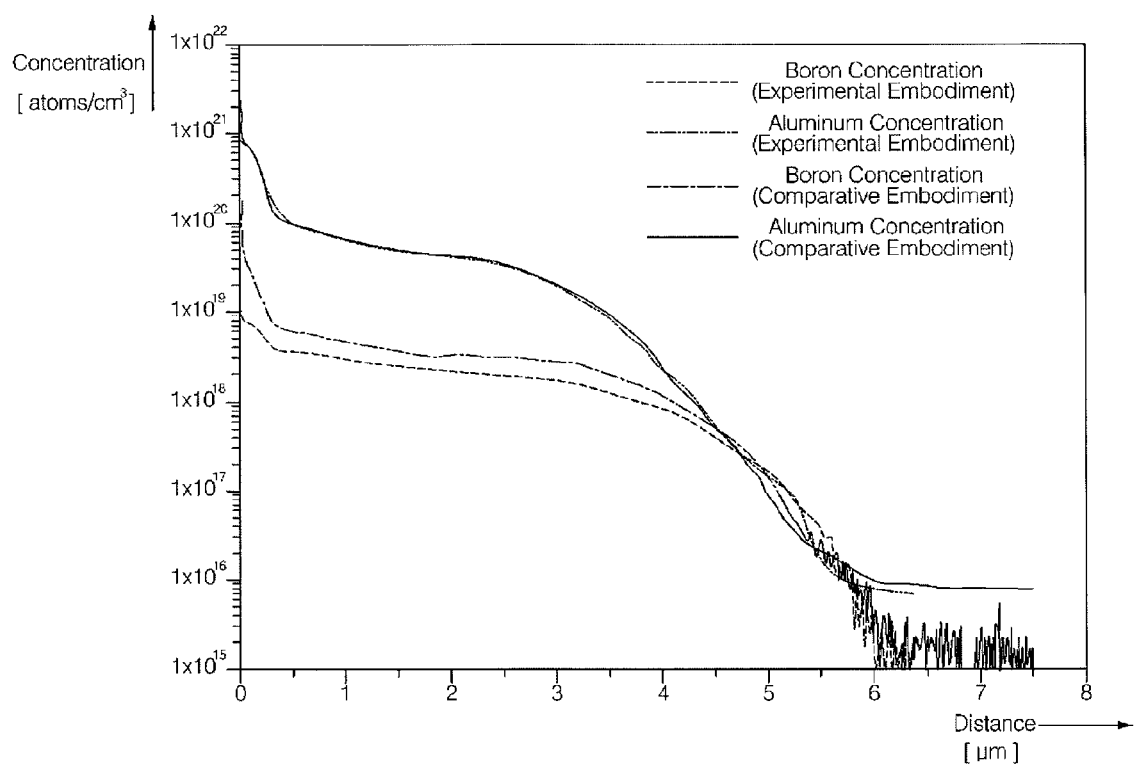
FIG. 10 is a graph of results of boron concentrations and aluminum concentrations with respect to a distance from a front surface of a semiconductor substrate in solar cells according to Experimental Embodiments and Comparative Embodiments.

With reference to FIG. 10, it can be seen that the boron concentration of the Experimental Embodiment is similar to the boron concentration of the Comparative Embodiment, and the aluminum concentration of the Experimental Embodiment is similar to the aluminum concentration of the Comparative Embodiment. The Experimental Embodiment does not have operations for forming the additional layer for doping and eliminating the same, and the aluminum concentration of the Experimental Embodiment is similar to the aluminum concentration of the Comparative Embodiment. That is, according to the Experimental Embodiment, the method can be simplified and a sufficient aluminum concentration can be achieved. Accordingly, in the Experimental Embodiment, the emitter layer having the selective structure with a high property can be formed by a simple process.

In this instance, the aluminum concentration is generally higher than the boron concentration, and thus, the resistance in the second portion of the emitter layer can be effectively reduced.

Figure 11:
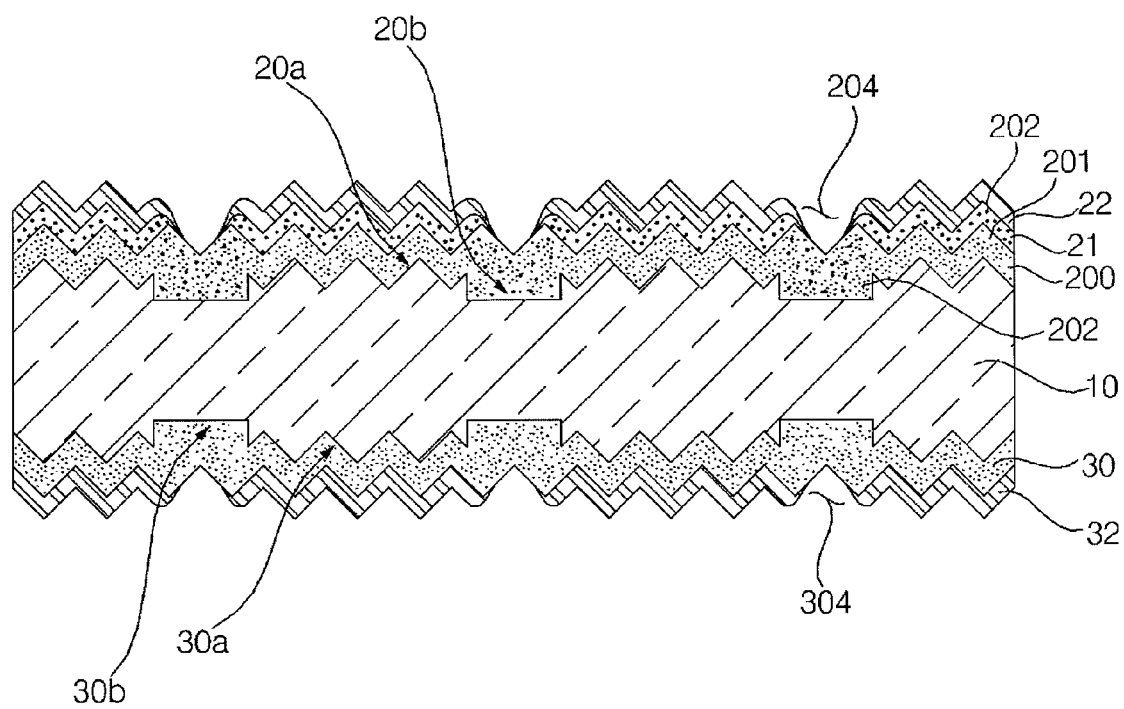
FIG. 11 is a cross-sectional view of a solar cell for illustrating an opening formed by a laser in order to describe in detail a shape of the opening according to an embodiment of the invention.

In cross-sectional views for describing the above embodiments of the invention, side surfaces of the opening 204 of the first passivation layer 21 and the anti-reflection layer 22 formed by the laser are perpendicular to the front surface of the semiconductor substrate 10, and side surfaces of the opening 304 of the second passivation layer 32 by the laser are perpendicular to the back surface of the semiconductor substrate 10. That is, the openings 204 and 304 have uniform areas. However, in reality, the openings 204 and 304 formed by the lasers have various side shapes in cross-sectional views, such as inclined sides or round sides as shown in FIG. 11. In this instance, the melted first passivation layer 21 and anti-reflection layer 22 may be stacked at the edges of the opening 204, and the melted second passivation layer 32 may be stacked at the edges of the opening 304. In FIG. 11, in order to show the openings 204 and 304 clearly, a stated in which the openings 204 and 304 are formed by the lasers is shown.

According to the embodiment of the invention, the emitter layer having the selective emitter structure can be formed by a simple process, and the property of the emitter layer and the align property of the emitter layer and the first electrode can be enhanced.

That is, the emitter layer having the selective structure is formed by forming the first passivation layer including the first dopant and selectively heating the first passivation layer to diffuse the first dopant. Thus, the operations for forming the additional layer for the doping and removing the same can be omitted. Thus, the process can be simplified and the cost can be reduced.

In this instance, when the first passivation layer is selectively heated by the laser, the width of the second portion can be minimized. Also, the opening can be formed at the anti-reflection layer and the first passivation layer by the laser, the first electrode formed through the opening can be accurately aligned with the high-concentration portion (the first portion) of the emitter layer.

When the aluminum is used for the second dopant, the difference in an atomic radius is small between the aluminum and the silicon that is an element of the semiconductor substrate. Thus, a low-powered laser can be used and dislocation density can decrease, thereby enhancing the efficiency of the solar cell.

Certain embodiments of the invention have been described. However, the embodiment of the invention are not limited to the specific embodiments described above, and various modifications of the embodiments are possible by those skilled in the art to which the invention belongs without departing from the scope defined by the appended claims.

What is claimed is:

1. A method for manufacturing a solar cell, the method comprising:
    preparing a semiconductor substrate;
    forming a passivation layer comprising a first dopant on a surface of the semiconductor substrate;
    forming a selective emitter layer by locally heating a portion of the passivation layer;
    forming an electrode electrically connected to a first portion of the selective emitter layer after the forming of the selective emitter layer; and
    forming a layer for a dopant layer by doping a second dopant having a conductive type the same as the first dopant to one surface of the semiconductor substrate between the preparing of the semiconductor substrate and the forming of the passivation layer,
    wherein, in the forming of the selective emitter layer, the first dopant of the heated portion of the passivation layer is diffused into an inside of the semiconductor substrate by the locally heating to form the selective emitter layer,
    wherein the forming of the selective emitter layer is a separate process from the forming of the electrode,
    wherein the first dopant has a conductive type different from that of the semiconductor substrate,
    wherein the selective emitter layer comprises a first portion in contact with the electrode and a second portion other than the first portion,
    wherein, in the forming of the selective emitter layer, the portion of the passivation layer corresponding to the first portion of the selective emitter layer where the electrode is connected is heated, and
    wherein, in the forming of the selective emitter layer, the portion of the passivation layer corresponding to the first portion of the selective emitter layer being heated and the first dopant being diffused into the semiconductor substrate results in the first portion having a resistance lower than that of the second portion.

2. The method according to claim 1, wherein, in the forming of the selective emitter layer, a laser is irradiated to the portion of the passivation layer corresponding to the first portion.

3. The method according to claim 1, wherein, in the forming of the selective emitter layer, the portion of the passivation layer corresponding to the first portion is heated to a temperature of about 1200 to 1600° C.

4. The method according to claim 2, wherein an opening is formed by the laser at the portion of passivation layer corresponding to the first portion in the forming of the selective emitter layer.

5. The method according to claim 1, wherein the first dopant and the second dopant are different from each other.

6. The method according to claim 1, wherein the first dopant comprises aluminum,
    wherein the second dopant comprises boron, and
    wherein the passivation layer comprises aluminum oxide.

7. The method according to claim 1, wherein the first dopant comprises bismuth,
    wherein the second dopant comprises phosphorus, and
    wherein the passivation layer comprises bismuth oxide.

8. The method according to claim 1, wherein a concentration of the first dopant at the first portion is higher than a concentration of the second dopant at the first portion.

9. The method according to claim 1, wherein, in the forming of the layer for the dopant layer, a thermal diffusion method or an ion-implantation method is used.

10. The method according to claim 1, wherein the first dopant is a p-type,
    wherein the first dopant comprises aluminum, and
    wherein the passivation layer comprises aluminum oxide.

11. The method according to claim 1, wherein the first dopant is an n-type,
    wherein the first dopant comprises bismuth, and
    wherein the passivation layer comprises bismuth oxide.

12. The method according to claim 1, wherein the passivation layer has a thickness of about 5 to 20 nm.

13. The method according to claim 1, further comprising:
    forming a back passivation layer including a third dopant and being formed at another surface of the semiconductor substrate; and
    forming a back surface field layer by locally heating a portion of the back passivation layer, wherein the third dopant of the back passivation layer is diffused into an inside of the semiconductor substrate by the locally heating.

* * * * *